(12) United States Patent
Sakurada et al.

(10) Patent No.: US 11,017,913 B2
(45) Date of Patent: May 25, 2021

(54) CRYSTAL AND SUBSTRATE OF CONDUCTIVE GAAS, AND METHOD FOR FORMING THE SAME

(71) Applicant: SUMITOMO ELECTRIC INDUSTRIES, LTD., Osaka (JP)

(72) Inventors: Takashi Sakurada, Itami (JP); Tomohiro Kawase, Itami (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 268 days.

(21) Appl. No.: 15/976,184

(22) Filed: May 10, 2018

(65) Prior Publication Data

US 2018/0261354 A1    Sep. 13, 2018

Related U.S. Application Data

(60) Division of application No. 13/953,421, filed on Jul. 29, 2013, now abandoned, which is a continuation of
(Continued)

(30) Foreign Application Priority Data

Jan. 20, 2009  (JP) .................... 2009-010222

(51) Int. Cl.
*C30B 29/42* (2006.01)
*H01B 1/02* (2006.01)
(Continued)

(52) U.S. Cl.
CPC ............... *H01B 1/02* (2013.01); *C22F 1/16* (2013.01); *C30B 11/00* (2013.01); *C30B 29/42* (2013.01);
(Continued)

(58) Field of Classification Search
CPC .......... C30B 29/42; C30B 11/00; C30B 29/40; C30B 33/02; C30B 33/00
See application file for complete search history.

(56) References Cited

U.S. PATENT DOCUMENTS 4,384,398 A    5/1983  Dutt
4,776,971 A *  10/1988  Mattera .................. C30B 29/42
                                                    252/62.3 GA
(Continued)

FOREIGN PATENT DOCUMENTS

CN    1865527 A    11/2006
DE    4021252 A1    1/1992
(Continued)

OTHER PUBLICATIONS

M. Suezawa et al., "Optical studies of heat-treated Si-doped GaAs bulk crystals", J. Appl. Phys., vol. 69, No. 3, pp. 1618-1624, Feb. 1, 1991.
(Continued)

*Primary Examiner* — Matthew J Song
(74) *Attorney, Agent, or Firm* — Faegre Drinker Biddle & Reath LLP

(57) ABSTRACT

An electrically conductive GaAs crystal has an atomic concentration of Si more than $1 \times 10^{17}$ cm$^{-3}$, wherein density of precipitates having sizes of at least 30 nm contained in the crystal is at most 400 cm$^{-2}$. In this case, it is preferable that the conductive GaAs crystal has a dislocation density of at most $2 \times 10^{-2}$ cm$^2$ or at least $1 \times 10^{-3}$ cm$^2$.

3 Claims, 2 Drawing Sheets

Related U.S. Application Data application No. 13/145,145, filed as application No. PCT/JP2010/050628 on Jan. 20, 2010, now abandoned.

(51) Int. Cl.
| | |
|---|---|
| *C30B 33/02* | (2006.01) |
| *C30B 11/00* | (2006.01) |
| *C30B 33/00* | (2006.01) |
| *C22F 1/16* | (2006.01) |

(52) U.S. Cl.
CPC ............. *C30B 33/00* (2013.01); *C30B 33/02* (2013.01); *Y10T 428/24355* (2015.01)

(56) References Cited

U.S. PATENT DOCUMENTS

| | | | | |
|---|---|---|---|---|
| 4,840,699 | A | * | 6/1989 | Khattak .................. C30B 11/00 117/3 |
| 4,902,376 | A | * | 2/1990 | Chen ...................... C30B 29/42 117/3 |
| 5,599,389 | A | | 2/1997 | Iwasaki |
| 5,612,014 | A | * | 3/1997 | Inoue ..................... C30B 11/00 117/2 |
| 5,629,231 | A | | 5/1997 | Kiehl |
| 2007/0012242 | A1 | | 1/2007 | Jurisch et al. |
| 2007/0034250 | A1 | | 2/2007 | Dutta |
| 2007/0079751 | A1 | | 4/2007 | Matsumoto |
| 2009/0098377 | A1 | | 4/2009 | Oshika |

FOREIGN PATENT DOCUMENTS

| | | |
|---|---|---|
| DE | 112006000771 T5 | 2/2008 |
| EP | 0206541 A2 | 12/1986 |
| JP | 48-039397 | 6/1973 |
| JP | 05-037015 | 2/1993 |
| JP | 05-043400 | 2/1993 |
| JP | 2002-029881 | 1/2002 |
| JP | 2004-115339 | 4/2004 |
| JP | 2007-081372 | 3/2007 |

OTHER PUBLICATIONS

Y. Okada et al., "Defect reactions by heat treatment of heavily silicon doped gallium arsenide", J. Appl. Phys., vol. 73, No. 4, pp. 1675-1680, Feb. 15, 1993.

H. Nakanishi et al., "Liquid encapsulated, vertical Bridgman growth of GaAs crystal with uniform EL2 concentration", Journal of Crystal Growth, 155, pp. 171-178, Apr. 1995.

C. Domke et al., "Changes of defect and active-dopant concentrations induced by annealing of highly Si-doped GaAs," Physical Review B, The American Physical Society, vol. 57, No. 8, Feb. 15, 1998, pp. 4482-4485.

Naeven, Ralf, "GaAs-Einkristallzucht mit totaler Flüssigeinkapselung im vertikalen Bridgman-Verfahren," Institut für Festkörperforschung, Berichte des Forschungszentrums Jülich, 2800, ISSN 0944-2952, published in Jul. 1993, pp. 1-132.

Extended European Search Report dated Oct. 21, 2020 in corresponding European patent application No. 10733485.6 (16 pages).

Communication pursuant to Rule 114(2) EPC dated Oct. 21, 2020 in corresponding European patent application No. 10733485.6 (16 pages).

* cited by examiner

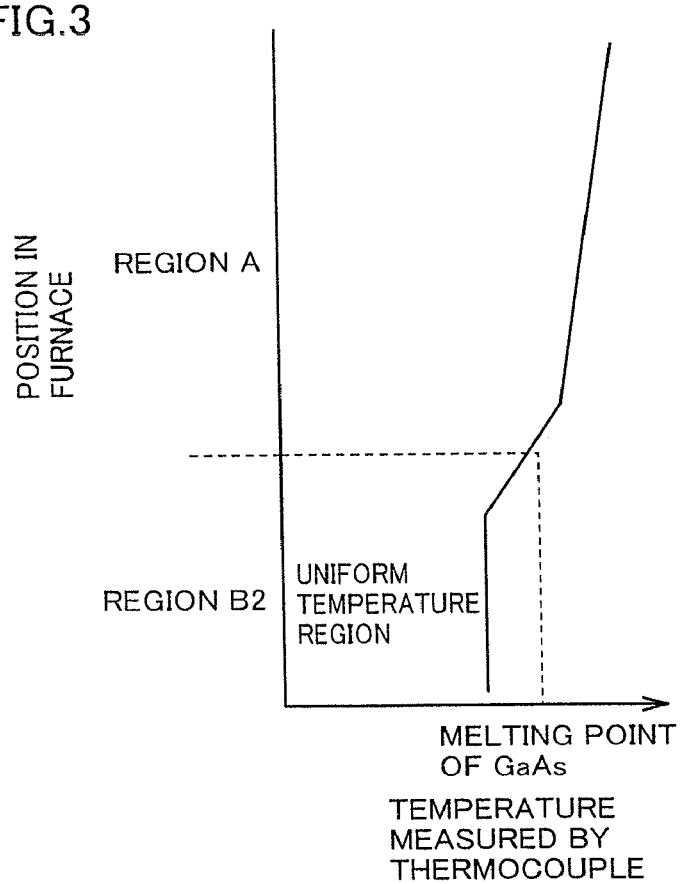

CRYSTAL AND SUBSTRATE OF CONDUCTIVE GAAS, AND METHOD FOR FORMING THE SAME

CROSS-REFERENCE TO RELATED APPLICATIONS

This application is a divisional of U.S. patent application Ser. No. 13/953,421, filed Jul. 29, 2013, now abandoned, which is a continuation of U.S. patent application Ser. No. 13/145,145, filed Jul. 19, 2011, now abandoned, which is a § 371 of International Application No. PCT/JP2010/050628, filed Jan. 20, 2010, the entire contents each of which are incorporated herein by reference.

TECHNICAL FIELD

The present invention relates to a crystal and a substrate of electrically conductive GaAs, and more particularly to reduction in size and density of precipitates contained in the crystal and substrate of conductive GaAs.

BACKGROUND ART

Microscopic concavities and convexities on a surface of a semi-insulating GaAs substrate are liable to cause structural defects of an epitaxial layer or a semiconductor device formed on the substrate. Therefore, substrates having many microscopic concavities and convexities on their surface are determined as faulty during screening in an optical inspection and adversely affect the yield of products. In some cases the microscopic concavities and convexities detected during the optical inspection are caused by sticking of minute particles generated during wafer processing of the substrate, in others they are caused by the crystal itself.

It is considered that arsenic precipitates anchored to dislocations are main cause for microscopic concavities and convexities on the semi-insulating GaAs substrate which are caused by the crystal itself, and it is known that it is possible to suppress the precipitation concentrated on dislocations by post-annealing (in a furnace for crystal growth) at 1100° C. for several hours (refer to Journal of Crystal Growth, 155, (1995), pp. 171-178 (Non-Patent Literature 1)).

In the case of producing a conductive GaAs single crystal, on the other hand, Si, Zn or the like is added as an impurity (dopant) for controlling the conductivity of the crystal. A substrate cut from a conductive GaAs crystal usually includes less microscopic concavities and convexities on its polished surface as compared with a semi-insulating GaAs substrate and thus scarcely causes a problem. In the case of conductive GaAs substrates for laser devices in particular, however, in association with miniaturization of the devices and increase in the yield due to innovation of the production technique, the microscopic concavities and convexities on the substrate surface lead to structural defects of the semiconductor devices and are liable to often cause problems. However, cause for microscopic concavities and convexities on the conductive GaAs substrate is not clear at all from the fact that the substrate cut from the conductive GaAs crystal usually includes less microscopic concavities and convexities on its polished surface as compared with the semi-insulating GaAs substrate and the fact that the density of microscopic concavities and convexities on the conductive substrate is hardly reduced even when the post-annealing is carried out similar to the case of the semi-insulating substrate. Incidentally, Patent Literature 1 (Japanese Patent Laying-Open No. 5-43400) tried a method for decreasing precipitates in a Cr-doped GaAs crystal produced by a horizontal boat method.

CITATION LIST

Patent Literature

PTL 1: Japanese Patent Laying-Open No. 5-43400

Non Patent Literature

NPL 1: Journal of Crystal Growth, 155, (1995), pp. 171-178

SUMMARY OF INVENTION

Technical Problem

The present inventors have investigated the reason for the fact that the density of the microscopic defects on the polished surface of the substrate cut from the conductive GaAs crystal is hardly reduced even when the post-annealing is carried out at 1100° C. for several hours similar to the case of the semi-insulating crystal. As a result, it is found that the cause for the microscopic surface concavities and convexities is different between the semi-insulating and conductive GaAs crystals.

For example, when an n-type conductive GaAs crystal contains too many Si atoms, it can be considered that part of the Si atoms are not substitutionally positioned at Ga sites or As sites but precipitate in a state of a single element or a compound with another element. In this case, the precipitates in the GaAs crystal have their physical properties different from those of the matrix. Therefore, when the GaAs crystal is processed into a substrate, microscopic concavities or convexities caused by the precipitates are liable to be formed on the substrate surface. Hereinafter, these microscopic concavities and convexities are also called as microscopic defects. The precipitates themselves are distributed not only in the substrate surface but also inside the substrate. In the case of a semiconductor device including the conductive GaAs substrate through which electric current passes, therefore, it is considered that the precipitates in the substrate adversely affect the properties and reliability of the semiconductor device. In other words, if the added dopant, e.g., Si is precipitated larger than a certain size in a state of a single element or a compound with another element during crystal growth of the conductive GaAs crystal, it is considered that the precipitates in the substrate surface cause the microscopic concavities or convexities on the substrate surface during processing the crystal into the substrate thereby degrading the surface quality and the precipitates inside the substrate cause degradation of the properties of the device formed on the substrate.

From the consideration as above, as a reason for the fact that the microscopic defects in the substrate surface of conductive GaAs crystal are not reduced even after the post-annealing at 1100° C., it can be considered that the precipitates in the conductive substrate are not in a state of a single element of As, differently from the case of the semi-insulating crystal.

Based on the inventors' consideration as above, an object of the present invention is to reduce the size and density of precipitates contained in the conductive GaAs crystal. Another object of the present invention is to provide a conductive GaAs substrate having a polished mirror surface on which a less density of microscopic concavities and convexities is detected by a surface particle inspection. Such a substrate is desirable from the viewpoint of producing miniaturized devices such as a laser device at a high yield.

Solution to Problem

A conductive GaAs crystal according to the present invention has an atomic concentration of Si more than $1 \times 10^{17}$ cm$^{-3}$, wherein a density of precipitates having sizes of at least 30 nm contained in the crystal is at most 400 cm$^{-2}$.

In this case, the conductive GaAs crystal preferably has a dislocation density of at most $5 \times 10^2$ cm$^{-2}$ or at least $1 \times 10^3$ cm$^{-2}$ and more preferably has a dislocation density of at most $2 \times 10^2$ cm$^{-2}$.

It is also preferable that the conductive GaAs crystal is grown and then annealed at a temperature of at least 1130° C. for at least 10 hours in a crystal growth furnace. The annealing temperature is preferably at least 1160° C. and more preferably at least 1200° C. Incidentally, it is preferable that the furnace temperature is not lowered to 600° C. or less before the annealing after crystal growth in the growth furnace.

A conductive GaAs crystal substrate cut from the conductive GaAs crystal and then polished can have a mirror surface in which a density of microscopic defects having sizes of at least 0.265 μm measured by a surface particle inspection devise is at most 0.5/cm$^2$. Incidentally, the defect density can be at most 0.3/cm$^2$ under better conditions of the substrate production and at most 0.1/cm$^2$ under further better conditions of the production.

Advantageous Effects of Invention

According to the present invention, it is possible to obtain a crystal and a substrate of conductive GaAs in which sizes and density of precipitates contained therein are reduced.

BRIEF DESCRIPTION OF DRAWINGS

FIG. 3 is a schematic graph showing a temperature distribution during post-annealing after the crystal growth in the crystal growth apparatus of FIG. 1.

DESCRIPTION OF EMBODIMENTS

In the following, a method for producing a crystal and a substrate of conductive GaAs according to the present invention is explained with comparison between specific embodiments and comparative examples.

Figure 1:
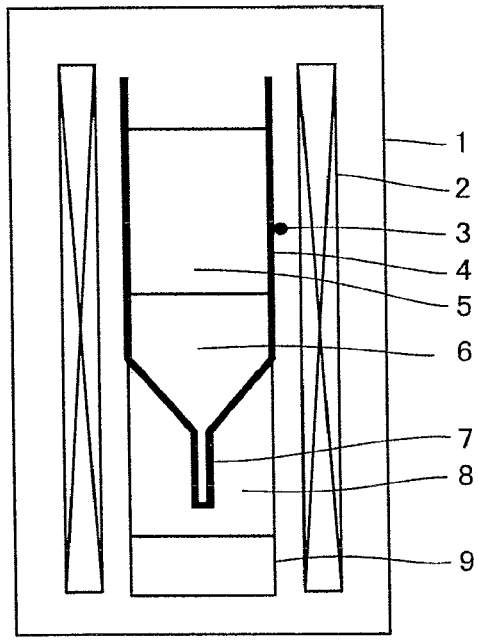
FIG. 1 is a schematic vertical cross-sectional view of a crystal growth apparatus usable in a vertical Bridgman method for producing a conductive GaAs crystal according to the present invention.

In FIG. 1, a crystal growth apparatus usable in a vertical Bridgman method for producing a conductive GaAs crystal according to the present invention is shown in a schematic vertical cross-sectional view. In this crystal growth apparatus, a plurality of heaters 2 are provided inside a furnace body 1. It is possible to separately control temperatures of these heaters 2. A thermocouple 3 and a crucible 4 made of pyrolytic boron nitride (pBN) are accommodated inside heaters 2.

As such, a GaAs single crystal is grown in crucible 4. Specifically, there exists GaAs melt 5 inside crucible 4 shown in FIG. 1 and there exists a GaAs single crystal 6 grown from a seed crystal 7 under GaAs melt 5.

Crucible 4 is supported on a pedestal 8 that is movable in upward and downward directions and also rotatable about the axis thereof by means of a movable shaft 9. During crystal growth, crucible 4 is gradually moved downward relative to heaters 2 in a temperature gradient region between a higher temperature region at an upper part and a lower temperature region at a lower part within furnace body 1, whereby GaAs single crystal 6 having the same crystallographic orientation as that of seed crystal 7 is gradually grown from melt 5.

GaAs single crystals according to various embodiments of the present invention and according to comparative examples have been produced by using a crystal growth apparatus as shown in FIG. 1. In each of the embodiments and comparative examples, GaAs seed crystal 7 was first inserted in a small diameter portion at the bottom of pBN crucible 4 with a body portion having a diameter of about 4 inches. GaAs polycrystals of six nines purity were used as source material for GaAs single crystal to be grown. GaAs polycrystals of about 10 kg and high purity Si were charged in crucible 4 and then the crucible was set in furnace body 1.

Figure 2:
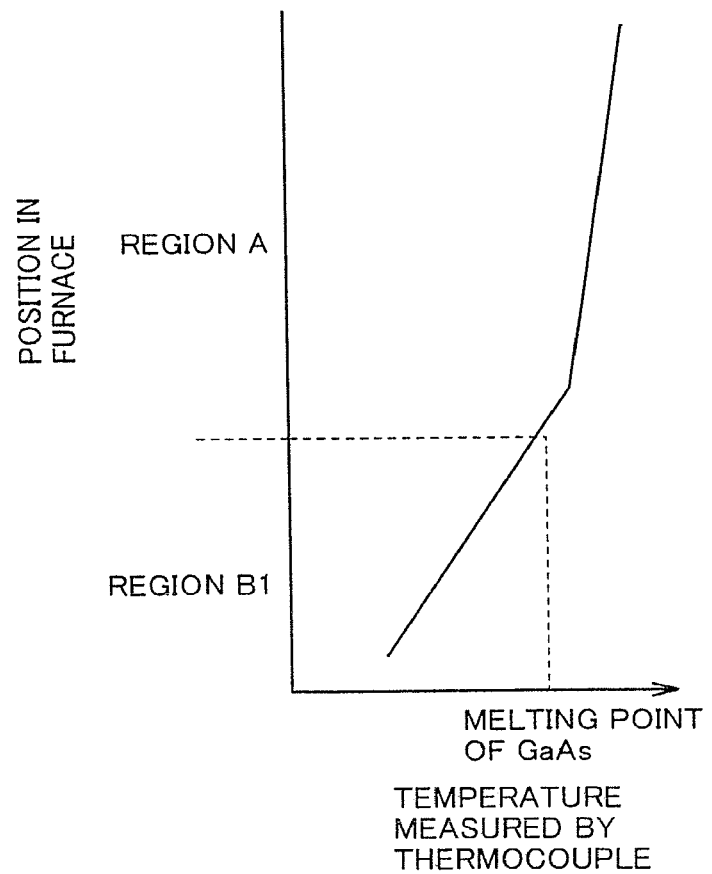
FIG. 2 is a schematic graph showing a temperature distribution during crystal growth in the crystal growth apparatus of FIG. 1.

The schematic graph of FIG. 2 shows a temperature distribution during crystal growth in the crystal growth apparatus of FIG. 1. Specifically, the horizontal axis in the graph of FIG. 2 represents the temperature and the vertical axis represents the position in the upward and downward directions in the furnace. The polycrystalline GaAs source material in crucible 4 is completely melted in a high temperature region A in this graph. Thereafter, by moving crucible 4 downward relative to heaters 2, GaAs melt 5 is cooled lower than its melting point in a region B1 having a temperature gradient, whereby GaAs single crystal 6 is grown on a seed crystal 7 from melt 5.

In some of the embodiments and some of the comparative examples, the post-annealing (annealing in the growth furnace) was carried out after growth of the GaAs single crystal. In this case, after the whole quantity of GaAs melt 5 was crystallized to a single crystal, the temperature distribution in furnace body 1 was transferred with a prescribed time from the state shown in FIG. 2 to the state shown in FIG. 3. Then, the grown GaAs single crystal was subjected to the post-annealing in a uniform temperature region at a prescribed temperature in a region B2 shown in the graph of FIG. 3. Thereafter, the GaAs single crystal was cooled from the post-annealing temperature to 900° C. at a cooling rate of about 20° C./hr and further cooled from 900° C. to 500° C. at a cooling rate of about 50° C./hr. Incidentally, uniform temperature region B2 is not necessarily needed. Under the condition that the region where the crystal resides is maintained at temperature of at least 1130° C., the same result can be obtained even if region B2 is not set to the uniform temperature.

The post-annealing according to the present invention is carried out subsequently to crystal growth in the growth furnace. If the grown crystal is once cooled to a room temperature and then annealed by heating the same again to a higher temperature, the post-annealing effect of the present invention is hardly obtained. Even in the case that the crystal temperature comes down after the crystal growth, it is preferable to maintain the crystal temperature more than 600° C. The post-annealing temperature is preferably at least 1130° C., more preferably at least 1160° C. and most preferably at least 1200° C. Under any temperature condition of at least 1130° C., the annealing time should be at least 10 hours and is preferably at least 20 hours and more preferably at least 40 hours.

In each case of the embodiments and the comparative examples, the obtained GaAs single crystal was subjected to circumferential grinding and then sliced into substrates. A main surface of the substrate was mirror-polished by mechanochemical polishing to finally obtain a shaped substrate of 4-inch diameter or 6-inch diameter.

On the surface of the shaped substrate, a total number of microscopic defects having sizes of at least 0.265 µm was counted by using a commercially available surface particle inspection device (KLA-Tencor Corporation, Surfscan 6220), and an averaged density of the microscopic defects was calculated by dividing the number by the measured area. Incidentally, the microscopic defects are formed mechanically or chemically due to hardness of microscopic precipitates different from the matrix or due to strain caused by the precipitates and thus the sizes of the microscopic defects are larger than the sizes of the microscopic precipitates.

To first explain the 4-inch diameter substrate, the substrate was etched in KOH melt to generate etch pits corresponding to dislocations. The number of etch pits was counted in every 1 mm square at an interval of 5 mm in the whole area except for an area from the periphery of the substrate to 3 mm inward from there and then an averaged dislocation density was calculated by averaging the counted numbers per area. It is possible to clearly distinguish the etch pits caused by the dislocations from the microscopic defects caused by the microscopic precipitates.

In the substrate, a carrier concentration was also measured by Hall measurement and an Si concentration was measured by SIMS (Secondary Ion-microprobe Mass Spectrometry). The Hall measurement was carried out on 10 chips cut from five areas that were the center area of the substrate and four areas in <110> directions at 46 mm from the center, and an averaged value obtained from the measured values was utilized. The data of SIMS is a result of analysis regarding only one area that was the center area of the substrate. Here, all the doped Si atoms in the GaAs crystal do not act as sources for carriers. For example, Si atoms contained in precipitates do not act as sources for carriers.

Further, the substrate was cleaved along a center axis perpendicular to its OF (Orientation Flat), and YAG laser light of 1.06 µm wavelength was irradiated perpendicular to the cleaved surface of the substrate. At this time, the spot diameter of the laser light was about 5 µm. The laser light was moved for scanning in a radial direction of the substrate, and light scattered by precipitates inside the crystal and emerging upward from an area of 1 mm square on the mirror surface of the substrate was detected by an infrared vidicon camera to thereby know the number and sizes of precipitates. The measurement was carried out on 10 positions at 8 mm pitch along the cleaved center axis, and the total number of precipitates having sizes of at least 30 nm was counted.

While the density of microscopic defects counted on the mirror surface of substrate is usually measured less as compared to the precipitation density examined by the infrared-ray scattering, there exists a correlation between those densities. It is considered as a reason for this that all precipitates residing in a certain depth range (corresponding to the size of laser light incident on the cleaved surface) of the substrate are counted from the precipitate images obtained by the infrared-ray scattering, while the concavities and convexities detected by the surface particle inspection are caused during polishing by precipitates emerging on the polished substrate surface.

Further, a laser structure was formed by stacking epitaxial layers on each substrate assessed as described above. Then, the yield of obtained laser chips was checked to investigate its relation with the density of microscopic defects on the substrate surface.

Table 1 summarizes the annealing conditions after crystal growth and the results of measurement as described above regarding various embodiments and various comparative examples.

TABLE 1

| | | substrate size | Si concentration (cm$^{-3}$) | carrier density (cm$^{-3}$) | averaged dislocation density (cm$^{-2}$) | precipitates of sizes at least 30 nm (number/mm$^2$) | number of microscopic defects on substrate surface (number) | density of microscopic defects on substrate surface (cm$^{-2}$) | lowering of temperature after crystal growth | post-annealing temperature (° C.) | post-annealing time (hr) | yield of test devices (%) |
|---|---|---|---|---|---|---|---|---|---|---|---|---|
| comparative examples | 1 | 4"φ | 8.8 × 10$^{17}$ | 6.5 × 10$^{17}$ | 830 | 31 | 260 | 3.21 | no | no post-annealing | | 51 |
| | 2 | | 7.1 × 10$^{17}$ | 5.7 × 10$^{17}$ | 650 | 25 | 180 | 2.22 | no | 980 | 20 | 57 |
| | 3 | | 6.5 × 10$^{17}$ | 4.8 × 10$^{17}$ | 780 | 30 | 240 | 2.96 | no | 1108 | 20 | 52 |
| | 4 | | 6.6 × 10$^{17}$ | 5.1 × 10$^{17}$ | 710 | 28 | 235 | 2.90 | no | 1124 | 10 | 53 |
| | 5 | 6"φ | 6.3 × 10$^{17}$ | 4.8 × 10$^{17}$ | 860 | 36 | 625 | 3.43 | no | 1100 | 20 | — |
| embodiments | 1 | 4"φ | 8.5 × 10$^{17}$ | 6.8 × 10$^{17}$ | 790 | 3 | 24 | 0.30 | no | 1132 | 10 | 74 |
| | 2 | | 7.3 × 10$^{17}$ | 5.1 × 10$^{17}$ | 860 | 3 | 22 | 0.27 | no | 1132 | 20 | 73 |
| | 3 | | 6.2 × 10$^{17}$ | 4.8 × 10$^{17}$ | 770 | 1 | 7 | 0.09 | no | 1132 | 40 | 75 |
| | 4 | | 6.8 × 10$^{17}$ | 5.2 × 10$^{17}$ | 690 | 4 | 39 | 0.48 | lowering to 550° C. | 1132 | 20 | 72 |
| | 5 | | 8.1 × 10$^{17}$ | 6.6 × 10$^{17}$ | 480 | 1 | 13 | 0.16 | no | 1132 | 20 | 74 |
| | 6 | | 6.9 × 10$^{17}$ | 5.3 × 10$^{17}$ | 180 | 0 | 6 | 0.07 | no | 1132 | 20 | 75 |
| | 7 | | 8.1 × 10$^{17}$ | 6.4 × 10$^{17}$ | 92 | 0 | 3 | 0.04 | no | 1132 | 20 | 78 |
| | 8 | | 9.8 × 10$^{17}$ | 7.1 × 10$^{17}$ | 48 | 0 | 2 | 0.02 | no | 1132 | 20 | 77 |
| | 9 | | 3.5 × 10$^{18}$ | 1.8 × 10$^{18}$ | 25 | 0 | 1 | 0.01 | no | 1132 | 20 | 78 |
| | 10 | | 3.5 × 10$^{17}$ | 2.4 × 10$^{17}$ | 1250 | 1 | 8 | 0.10 | no | 1132 | 20 | 75 |
| | 11 | | 1.2 × 10$^{17}$ | 8.5 × 10$^{16}$ | 3300 | 1 | 11 | 0.14 | no | 1132 | 20 | 76 |
| | 12 | | 8.2 × 10$^{17}$ | 6.5 × 10$^{17}$ | 750 | 2 | 15 | 0.19 | no | 1160 | 10 | 74 |
| | 13 | | 5.1 × 10$^{17}$ | 3.8 × 10$^{17}$ | 980 | 1 | 8 | 0.10 | no | 1204 | 20 | 75 |
| | 14 | 6"φ | 6.7 × 10$^{17}$ | 5.2 × 10$^{17}$ | 830 | 2 | 32 | 0.18 | no | 1162 | 20 | — |

The annealing after crystal growth was carried out at a temperature of region B2 raised to a prescribed temperature after the crystal growth as shown in FIG. 3. The annealing times were 10 hours in comparative example 4, 10 hours in embodiment 1, 40 hours in embodiment 3, 10 hours in embodiment 12, and 20 hours in the other embodiments and other comparative examples, except for comparative example 1 in which the annealing after crystal growth was not carried out. In embodiment 4, the temperature in the growth furnace was once lowered to 550° C. after crystal growth and then again raised to 1132° C. to carry out the annealing for 20 hours.

In comparative example 5 and embodiment 14, substrates of 6-inch diameter were produced. To explain production of the 6-inch diameter substrate, GaAs polycrystals of six nines purity of about 20 kg were used as source material. The other conditions are almost the same as those in the case of the 4-inch diameter crystal.

On the surface of the shaped 6-inch diameter substrate also, a total number of microscopic defects having sizes of at least 0.265 µm was counted by using the commercially available surface particle inspection device (KLA-Tencor Corporation, Surfscan 6220), and an averaged density of the microscopic defects was calculated by dividing the number by the measured area. These microscopic defects are formed mechanically or chemically due to hardness of microscopic precipitates different from the matrix or strain caused by the precipitates and thus the sizes of the microscopic defects are larger than the sizes of the microscopic precipitates.

Next, the substrate was etched in KOH melt to generate etch pits corresponding to dislocations. The number of etch pits was counted in every 1 mm square area at an interval of 5 mm in the whole area except for an area from the periphery of the substrate to 3 mm inward from there and then an averaged dislocation density was calculated by averaging the counted numbers per area. It is possible to clearly distinguish the etch pits caused by the dislocations from the microscopic defects caused by the microscopic precipitates.

In the 6-inch diameter substrate also, a carrier concentration was measured by Hall measurement and an Si concentration was measured by SIMS (Secondary Ion-microprobe Mass Spectrometry). The Hall measurement was carried out on 10 chips cut from five areas that were the center area of the substrate and four areas in <110> directions at 71 mm from the center and then an averaged value of the measured values was utilized. The data of SIMS is a result of analysis regarding only one area that was the center area of the substrate. All the doped Si atoms in the GaAs crystal do not act as sources for carriers. For example, Si atoms contained in precipitates do not act as sources for carriers.

Further, the 6-inch diameter substrate was cleaved along a center axis perpendicular to its OF, and a YAG laser light of 1.06 µm wavelength was irradiated perpendicular to the cleaved surface of the substrate. The spot size of the laser light was about 5 µm. The laser light was moved for scanning in the radial direction of the substrate. Light scattered by precipitates inside the crystal and emerging from an area of 1 mm square on the mirror surface of the substrate was detected by the infrared vidicon camera to thereby know the number and size of precipitates. The measurement was carried out on 10 positions at 12 mm pitch along the cleaved center axis, and the total number of precipitates having sizes of at least 30 nm was counted.

While the density of microscopic defects counted on the mirror surface of substrate is usually measured less as compared to the precipitation density examined by the infrared-ray scattering, there exists a correlation between those densities. It is considered as a reason for this that all precipitates residing in a certain depth range (corresponding to the size of laser light incident on the cleaved surface) of the substrate are counted from the precipitate images obtained by the infrared-ray scattering, while the concavities and convexities detected by the surface particle inspection are caused during polishing by precipitates emerging on the polished substrate surface.

In the various embodiments and various comparative examples shown in Table 1, the Si concentration was adjusted by variously changing the Si doping amount. Further, the dislocation density was variously changed by changing the Si doping amount and also by controlling the temperature distribution and gradual cooling rate in the crucible during growth of the GaAs single crystals.

Considering the results shown in Table 1, the following factual correlations are derived.

First, while an object of the present invention is to reduce the precipitates of large sizes in the conductive GaAs single crystal, the number of precipitates having sizes of at least 30 nm in a field of 1 mm$^2$ is at least 25 in each of the GaAs substrates of comparative examples 1-5, but the number is dramatically reduced to at most 4 in each of embodiments 1-14 and this corresponds to at most 400 cm$^{-2}$ by conversion to the density.

Further, while another object of the present invention is to reduce the density of microscopic defects on the polished substrate surface, the density is at least 2 cm$^{-2}$ on the polished GaAs substrate surface in each of comparative examples 1-5, but the density is reduced to at most 0.5 cm$^{-2}$ in each of embodiments 1-14 and as a result the yield of the laser device formed on the substrate is improved in each of the embodiments. Here, the post-annealing was not carried out in comparative example 1, and the post-annealing temperature of the GaAa crystal in each of comparative examples 2-5 was less than 1130° C. In each of embodiments 1-14, on the other hand, the post-annealing temperature was at least 1130° C. and the annealing time was at least 10 hours. From these results, it is understood that the post-annealing at a temperature of at least 1130° C. for at least 10 hours is needed to achieve the objects of the present invention.

Next, comparison is made between embodiments 1-4 in which the post-annealing was carried out at 1132° C. Embodiments 1-3 are different from each other in the post-annealing time. Embodiment 4 is the same as embodiment 2 in terms of the post-annealing time but different in the point that the temperature of the crystal after growth was once lowered to 550° C. When the embodiments are compared regarding the number of precipitates having sizes of at least 30 nm and the density of microscopic defects on the polished substrate surface, it is seen that the number of precipitates having sizes of least 30 nm is the smallest and the density of microscopic defects on the polished substrate surface is also the lowest in embodiment 3 in which the post-annealing was carried out for 40 hours. In contrast, the number of precipitates having sizes of at least 30 nm is increased and the density of microscopic defects is also increased in embodiment 4 in which the temperature of the crystal after growth was once lowered to 550° C. This result shows that it is preferable to make the post-annealing time longer and not to lower the temperature of the grown crystal to 550° C. or less in order to suppress the precipitates having sizes of at least 30 nm and reduce the density of microscopic defects on the polished substrate surface.

Comparison is made between embodiments 2 and 5-11 in which influence of the dislocation density was investigated. The GaAs crystals of these embodiments were all subjected to the post-annealing at 1132° C. for 20 hours but are different in their dislocation densities. Specifically, the dislocation densities are 860 cm$^{-2}$ in embodiment 2, 480 cm$^{-2}$ in embodiment 5, 180 cm$^{-2}$ in embodiment 6, 92 cm$^{-2}$ in embodiment 7, 48 cm$^{-2}$ in embodiment 8, 25 cm$^{-2}$ in embodiment 9, 1250 cm$^{-2}$ in embodiment 10, and 3300 cm$^{-2}$ in embodiment 11. Here, the number of precipitates having sizes of at least 30 nm is less and the density of microscopic defects is lower in each of embodiments 5-11 as compared with embodiment 2. A reason for this can be considered as follows.

In general, the dislocations can be nucleation sites for the precipitates. However, it can be considered that in the case of a low dislocation density of 500 cm$^{-2}$ or less, the nucleation sites for precipitation of Si atoms are too few and thus both the precipitates having smaller sizes and precipitates having larger sizes are less generated. In support of this consideration, as the dislocation density is lower, the number of precipitates having sizes of at least 30 nm is reduced and the density of microscopic defects on the polished substrate surface is also reduced in embodiments 5-9 as compared with embodiment 2.

In contrast, in the case of a high dislocation density of 1000 cm$^{-2}$ or more, there exist a lot of dislocations relatively near Si atoms, which can be nucleation sites for precipitates. As such, it can be considered that since precipitates are dispersedly generated using dislocations as nucleation sites, precipitates are not concentrated on a part of dislocations and thus precipitates having larger sizes are less generated. Further, it can be considered that since the size of each precipitate is small even though precipitates are generated, the density of microscopic defects measured by the surface particle inspection device becomes lower. In support of this consideration, the number of precipitates having sizes of at least 30 nm is smaller and the density of microscopic defects on the polished substrate surface is lower in each of embodiments 10 and 11 as compared with embodiment 2.

Further, the following factual relation is derived from correlations between embodiments 1, 2, 12, and 13. Specifically, it is seen that as the post-annealing temperature becomes higher, the number of precipitates having sizes of at least 30 nm becomes smaller and the density of microscopic defects on the polished substrate surface also becomes lower. Furthermore, it can be understood that in the case of the post-annealing temperature of 1160° C. or more, even though the annealing time is reduced, it is possible to obtain a result similar to that in the case of a lower annealing temperature.

From the results of comparative example 5 and embodiment 14, it can be considered that the same consideration regarding the 4-inch crystals apples to the 6-inch crystals.

In summary, it is understood from the results shown in Table 1 that in the case of the conductive GaAs crystal, the microscopic concavities and convexities on the polished substrate surface caused by precipitates in the crystal cannot be sufficiently reduced by the post-annealing at less than 1130° C. but can be reduced by the post-annealing at 1130° C. or more according to the present invention and then it is possible to improve the quality and yield of epitaxial layers or devices formed on the substrate. In order to obtain these effects, the dislocation density is preferably at most 500 cm$^{-2}$ or at least 1000 cm$^{-2}$ and more preferably at most 200 cm$^{2}$.

According to the present invention, it is possible to obtain a conductive GaAs crystal in which sizes of precipitates contained therein are reduced and density of the precipitates is also lowered. On a substrate cut from the crystal and polished, density of microscopic defects having sizes of at least 0.265 μm detected by a surface particle inspection device can be at most 0.5/cm$^2$. Further, the defect density can be 0.3/cm$^2$ under better conditions of the substrate production according to the present invention and can be 0.1/cm$^2$ under further better conditions of the production.

While crystal growth with a vertical Bridgman method (VB method) has been explained in the above various embodiments, the present invention can also apply a VGF method (Vertical Gradient Freeze method) to the crystal growth. While the VGF method uses process conditions such as temperature control changed as compared to the VB method, it is also applicable to crystal growth subjected to the substantially same temperature history as in the present invention.

INDUSTRIAL APPLICABILITY

As described above, according to the present invention, it is possible to provide a conductive GaAs crystal and a substrate obtained from the crystal in which sizes of precipitates contained therein are reduced and density of the precipitates is lowered.

REFERENCE SIGNS LIST

1 furnace body; 2 heater; 3 thermocouple; 4 pBN crucible; 5 GaAs melt; 6 GaAs single crystal; 7 seed crystal; 8 pedestal; and 9 movable shaft.

The invention claimed is:
1. A method for producing a conductive GaAs bulk crystal, the conductive GaAs bulk crystal having an atomic concentration of Si more than $1\times10^{17}$ cm$^{-3}$, and a density of precipitates having sizes of at least 30 nm contained in the crystal being at most 400 cm$^{-2}$, the method comprising:
   growing the conductive GaAs bulk crystal in a growth furnace; and
   after the whole quantity of GaAs melt is crystalized, maintaining a temperature in the growth furnace more than 600° C., and annealing the conductive GaAs bulk crystal at a temperature of at least 1130° C. for at least 10 hours.
2. The method for producing the conductive GaAs bulk crystal according to claim 1, wherein the conductive GaAs bulk crystal is annealed at a temperature of at least 1160° C.
3. The method for producing the conductive GaAs bulk crystal according to claim 1, wherein the conductive GaAs bulk crystal is annealed at a temperature of at least 1200° C.

* * * * *